(12) United States Patent
Chou et al.

(10) Patent No.: US 11,602,908 B1
(45) Date of Patent: Mar. 14, 2023

(54) METHOD OF MESH GENERATION FOR RESIN TRANSFER MOLDING PROCESS

(71) Applicant: CORETECH SYSTEM CO., LTD., Zhubei (TW)

(72) Inventors: Ching-Kai Chou, Zhubei (TW); Chien-Ting Wu, Zhubei (TW); Hsun Yang, Zhubei (TW); Li-Hsuan Shen, Zhubei (TW); Chih-Chung Hsu, Zhubei (TW); Chia-Hsiang Hsu, Zhubei (TW); Rong-Yeu Chang, Hsinchu (TW)

(73) Assignee: CORETECH SYSTEM CO., LTD., Zhubei (TW)

( * ) Notice: Subject to any disclaimer, the term of this patent is extended or adjusted under 35 U.S.C. 154(b) by 0 days.

(21) Appl. No.: 17/564,744

(22) Filed: Dec. 29, 2021

Related U.S. Application Data

(60) Provisional application No. 63/235,878, filed on Aug. 23, 2021.

(51) Int. Cl.
| | |
|---|---|
| *B29C 70/54* | (2006.01) |
| *B29C 70/00* | (2006.01) |
| *B29C 70/48* | (2006.01) |
| *G06F 30/20* | (2020.01) |
| *G06F 9/455* | (2018.01) |
| *G06F 30/33* | (2020.01) |

(52) U.S. Cl.
CPC .......... *B29C 70/54* (2013.01); *B29C 70/003* (2021.05); *B29C 70/48* (2013.01); *G06F 30/20* (2020.01); *G06F 9/455* (2013.01); *G06F 30/33* (2020.01)

(58) Field of Classification Search
CPC ....... B29C 70/54; B29C 70/003; B29C 70/48; G06F 9/455; G06F 30/20; G06F 30/33
See application file for complete search history.

(56) References Cited

U.S. PATENT DOCUMENTS 9,811,616 B2 * 11/2017 Pena .................. G06F 30/23

OTHER PUBLICATIONS

Soukane, S., and F. Trochu. "New remeshing applications in resin transfer molding." Journal of reinforced plastics and composites 24.15 (2005): 1629-1653. (Year: 2005).*

* cited by examiner

*Primary Examiner* — Galen H Hauth
(74) *Attorney, Agent, or Firm* — Muncy, Geissler, Olds & Lowe, P.C.

(57) ABSTRACT

The present disclosure provides a method of mesh generation for an RTM process, including operations of: obtaining a geometry of a target object; generating a solid mesh of the target object according to the geometry; obtaining material characteristics of the target object; assembling a runner mesh with the solid mesh, wherein the runner mesh has grid dimensions different from those of the solid mesh; determining process parameters of the RTM process; and generating a forecasted result of the RTM process according to the solid mesh, the runner mesh, the process parameters, and the material characteristics. Generating the solid mesh includes operations of: dividing the geometry into modules; generating a first and second modular meshes corresponding to a first and second modules, wherein the second modular mesh abuts the first modular mesh, and the second modular mesh has grid dimensions different from those of the first modular mesh.

10 Claims, 7 Drawing Sheets

METHOD OF MESH GENERATION FOR RESIN TRANSFER MOLDING PROCESS

CROSS-REFERENCE TO RELATED APPLICATIONS

This application claims the benefit of previously-filed provisional application No. 63/235,878, filed Aug. 23, 2021, which is incorporated by reference in its entirety.

TECHNICAL FIELD

The present disclosure relates to a mesh generation method, and more particularly, to a mesh generation method for a resin transfer molding process.

DISCUSSION OF THE BACKGROUND

Resin transfer molding (RTM) has been widely used in production of fiber composite products. However, resin flow during RTM is not easy to predict. Computer-aided engineering (CAE) is used to predict the resin flow during the RTM process. Still, with increasing complexity of resin products, a time-consuming procedure is required for CAE to accurately predict the resin flow. Therefore, an efficient way to obtain a forecasted result of the RTM process has become a critical issue in this field.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of mesh generation for an RTM process. The method includes operations of: obtaining a geometry of a target object; generating a solid mesh of the target object according to the geometry; obtaining material characteristics of the target object; assembling a runner mesh of a runner with the solid mesh, wherein the runner mesh has grid dimensions different from those of the solid mesh; determining process parameters of the RTM process; and generating a forecasted result of the RTM process according to the solid mesh, the runner mesh, the process parameters, and the material characteristics. Generating the solid mesh of the target object according to the geometry includes operations of: dividing the geometry into a plurality of modules; generating a first modular mesh of the solid mesh corresponding to a first module of the plurality of modules; and generating a second modular mesh of the solid mesh corresponding to a second module of the plurality of modules, wherein the second modular mesh abuts the first modular mesh, and the second modular mesh has grid dimensions different from those of the first modular mesh.

In some embodiments, generating the solid mesh of the target object according to the geometry further includes operations of: assembling the first modular mesh with the second modular mesh; and determining a first ply orientation of the first modular mesh and a second ply orientation of the second modular mesh.

In some embodiments, the method further includes operations of: determining whether the forecasted result satisfies a requirement of the RTM process; and performing the RTM process on the target object according to the process parameters when the forecasted result satisfies the requirement.

In some embodiments, the method further includes adjusting the process parameters when the forecasted result does not satisfy the requirement.

In some embodiments, the method further includes adjusting a location of the runner mesh on the solid mesh when the forecasted result does not satisfy the requirement.

In some embodiments, the method further includes adjusting the first ply orientation and the second ply orientation when the forecasted result does not satisfy the requirement.

In some embodiments, the method further includes generating the forecasted result of the RTM process according to the solid mesh, the runner mesh, the process parameters, and the material characteristics again, when the forecasted result does not satisfy the requirement.

In some embodiments, generating the solid mesh of the target object according to the geometry further includes operations of: determining a first grid of the first modular mesh; and determining a second grid of the second modular mesh. The first modular mesh is generated according to the first grid, and the second modular mesh is generated according to the second grid.

In some embodiments, the first grid includes a first number of segments along a boundary between the first modular mesh and the second modular mesh, and the second grid includes a second number of segments along the boundary.

In some embodiments, the first number is different from the second number.

Another aspect of the present disclosure provides an RTM system, including a mold, a resin supply source, a resin tank, and a computing apparatus. The mold is configured to form a target object. The resin supply source is configured to provide a resin for the RTM process. The resin tank is configured to receive the resin from the mold during the RTM process. The computing apparatus includes a process module. The process module is configured to perform: obtaining a geometry of the target object; generating a solid mesh of the target object according to the geometry; obtaining material characteristics of the target object; assembling a runner mesh of a runner with the solid mesh, wherein the runner mesh has grid dimensions different from those of the solid mesh; determining process parameters of the RTM process; and generating a forecasted result of the RTM process according to the solid mesh, the runner mesh, the process parameters, and the material characteristics.

In some embodiments, when generating the solid mesh, the process module is configured to: dividing the geometry into a plurality of modules; generating a first modular mesh of the solid mesh corresponding to a first module of the plurality of modules; and generating a second modular mesh of the solid mesh corresponding to a second module of the plurality of modules, wherein the second modular mesh abuts the first modular mesh, and the second modular mesh has grid dimensions different from those of the first modular mesh.

In some embodiments, the computing apparatus further includes a storage module and an input/output (I/O) interface. The storage module is configured to store geometry of the target object, the solid mesh, the first modular mesh, the second modular mesh, the material characteristics, the run mesh, the process parameters, and the forecasted result.

In some embodiments, the computing apparatus further includes a display. The display is configured to display the forecasted result. The I/O interface is configured to transmit the forecasted result to the display The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
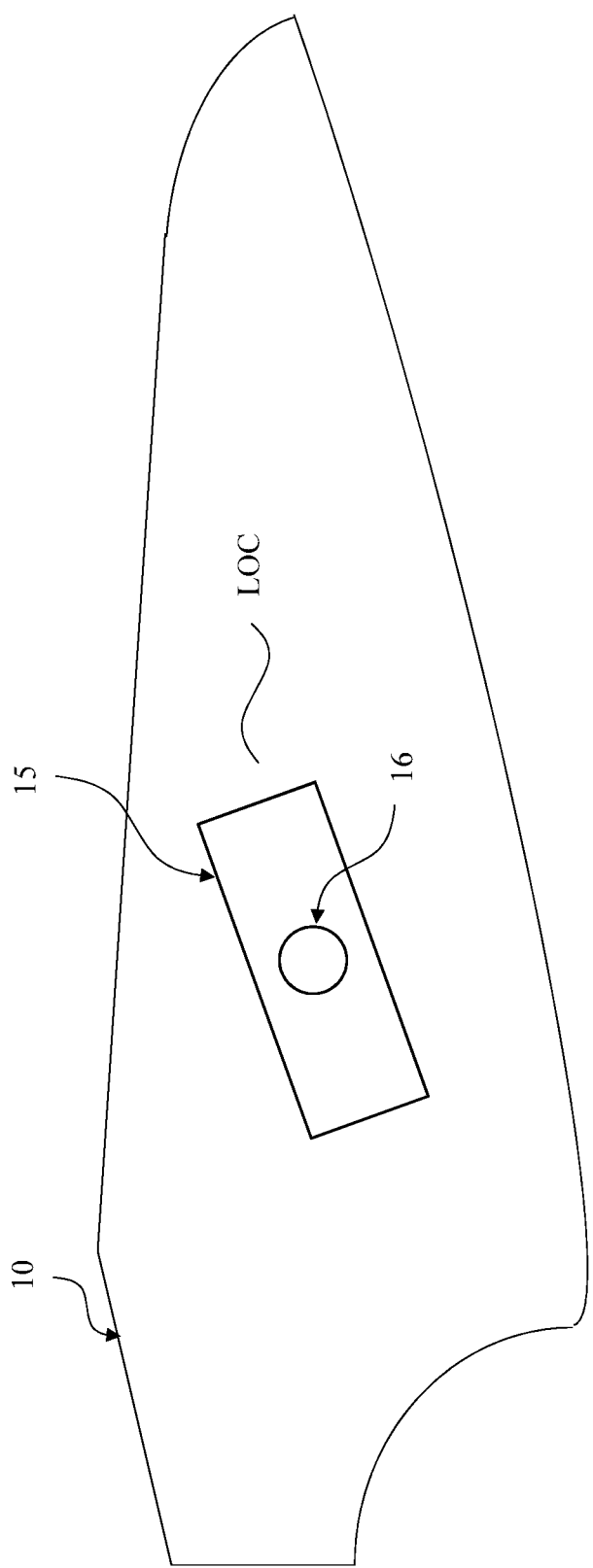
FIG. 1 is a schematic diagram of a target object according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a target object 10 of a resin transfer molding (RTM) process according to some embodiments of the present disclosure. The target object 10 is a three-dimensional space, and the space is configured to be filled by resin under the RTM process through a gate 16 of a runner 15, so as to form a resin product. In some embodiments, the target object 10 is a space inside a wind turbine. However, the present disclosure is not limited thereto.

Figure 2:
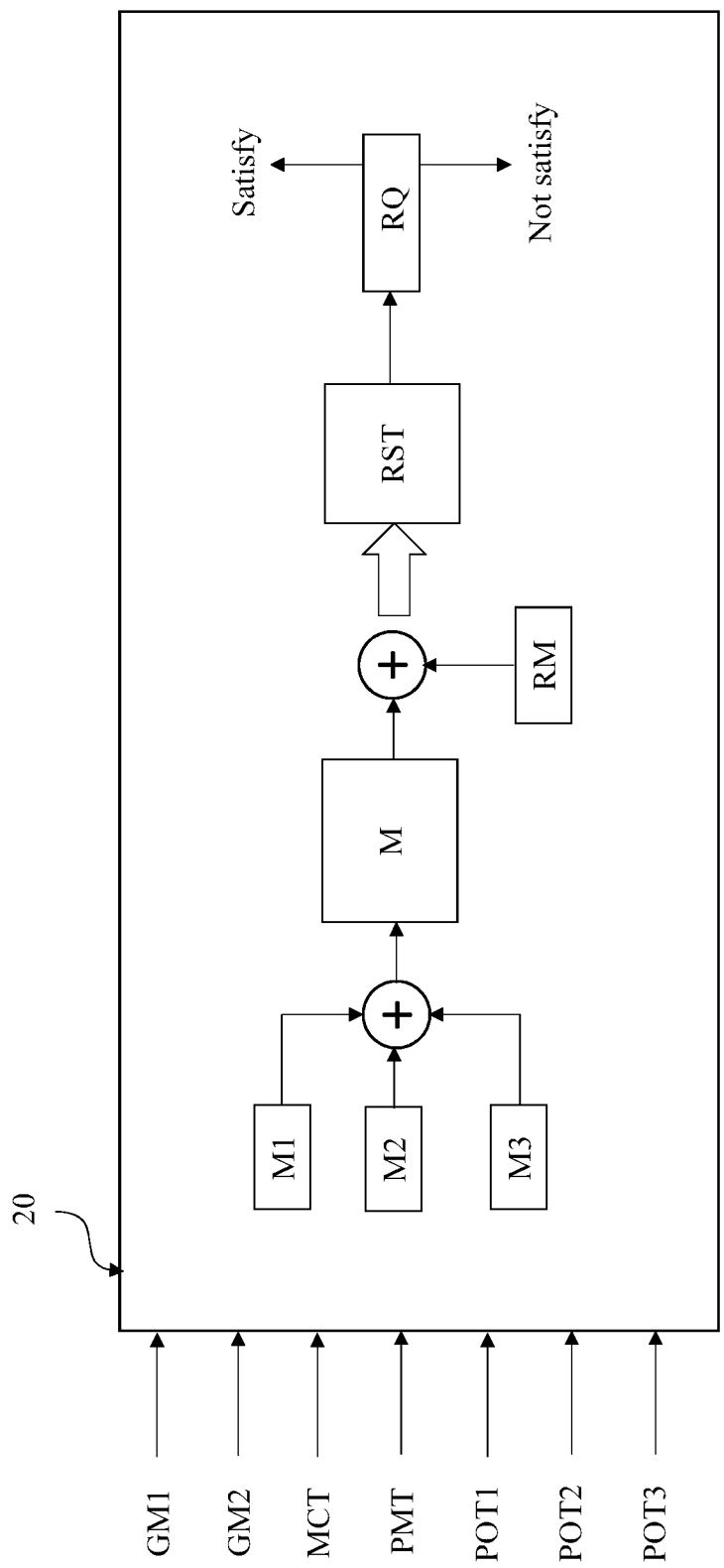
FIG. 2 is a schematic diagram of a computer-aided engineering (CAE) tool according to some embodiments of the present disclosure.
Figure 3:
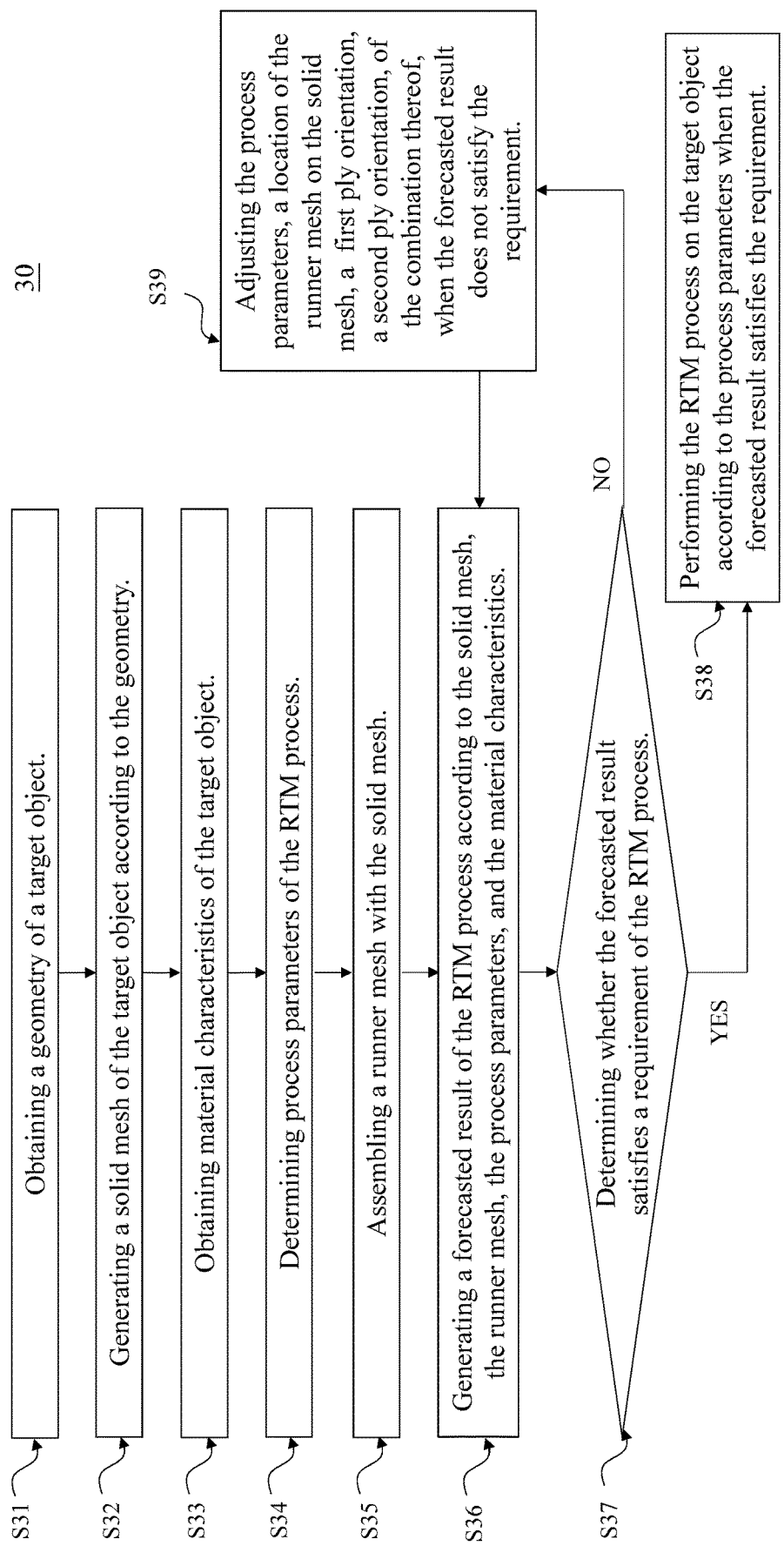
FIG. 3 is a flowchart of a method according to some embodiments of the present disclosure.
Figure 4:
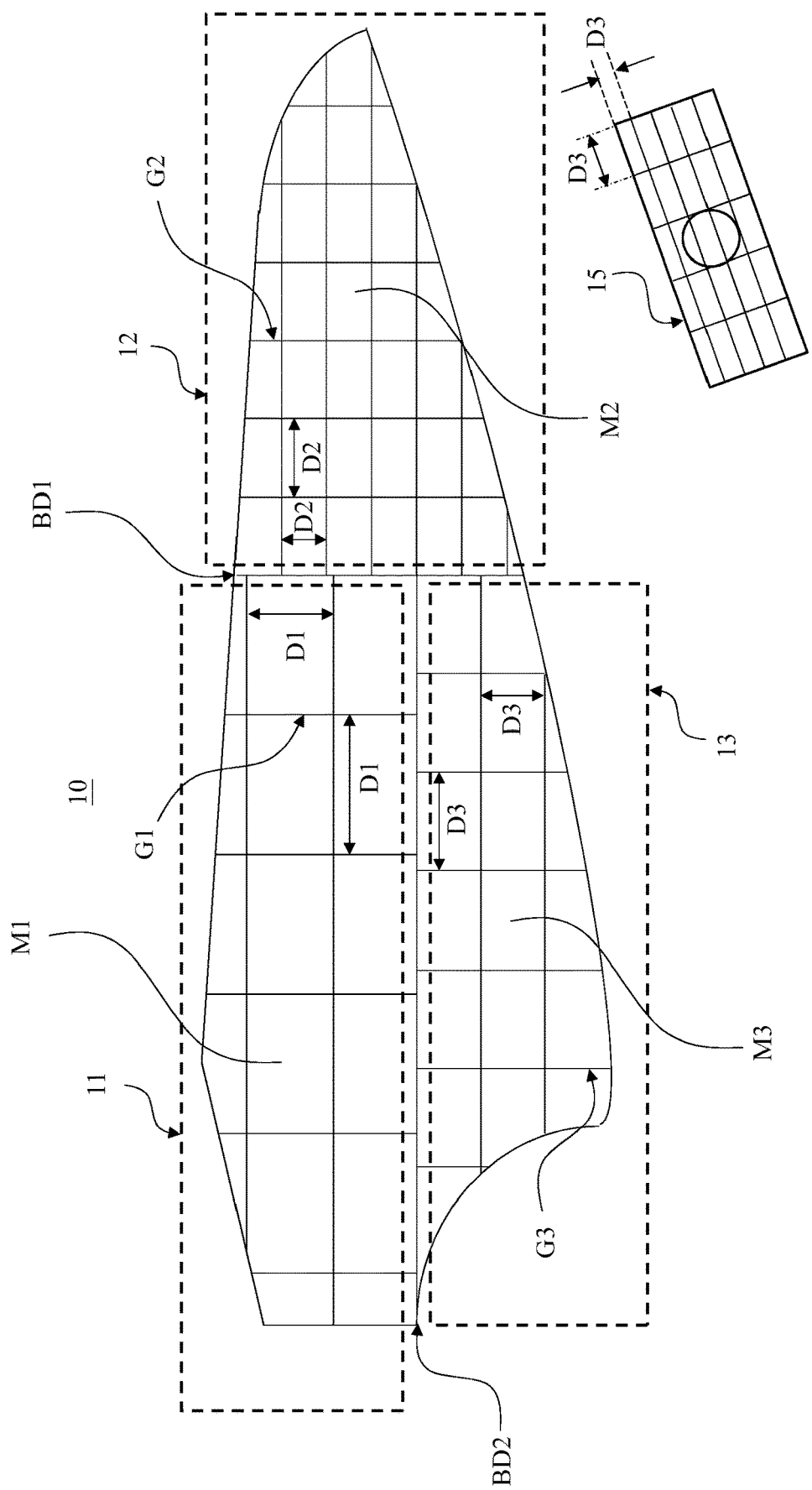
FIG. 4 is a schematic diagram of the target object with a solid mesh and the runner with a runner mesh according to some embodiments of the present disclosure.

Please refer to FIGS. 2, 3 and 4. FIG. 2 is a schematic diagram of a computer-aided engineering (CAE) tool 20 according to some embodiments of the present disclosure. FIG. 3 is a flowchart of a method 30 according to some embodiments of the present disclosure. FIG. 4 is a schematic diagram of the target object 10 with a solid mesh M and the runner 15 with a runner mesh RM according to some embodiments of the present disclosure. The runner 15 is illustrated separately from the target object 10 for clarity.

Before the RTM process is performed, a forecasted result RST of the RTM process is generated by the CAE tool 20 according to a geometry GM1 of the target object 10, a geometry GM2 of the runner 15, material characteristics MCT, process parameters PMT, and ply orientations POT1 to POT3. When the forecasted result RST satisfies a requirement RQ of the RTM process, the RTM process is performed on the target object 10 to form the resin product. In contrast, when the forecasted result RST does not satisfy the requirement RQ, the RTM process is not performed, and the CAE tool 20 generates another forecasted result RST using a different setting.

In some embodiments, the CAE tool 20 is configured to perform the method 30 to generate the forecasted result RST. Specifically, the CAE tool 20 performs the method 30 to generate the solid mesh M which is used for generating the forecasted result RST of the RTM process. A flowing behavior of the resin during the RTM process is forecasted based on the solid mesh M, and the forecasted result RST is obtained according to the flowing behavior. The method 30 includes operations S31, S32, S33, S34, S35, S36, S37, S38, and S39. To facilitate understanding, the method 30 is described with respect to FIGS. 1 to 4.

In operation S31, the CAE tool 20 obtains the geometry GM1 of the target object 10. In some embodiments, the CAE tool 20 further obtains the geometry GM2 of the runner 15. The geometry GM1 and the geometry GM2 include information of surface contours of the target object 10 and the runner 15, respectively. In some embodiments, the geometry GM1 and the geometry GM2 are implemented by computer-aided drawing (CAD) files. In some embodiments, the geometry GM2 is a built-in CAD file in the CAE tool 20.

Figure 5:
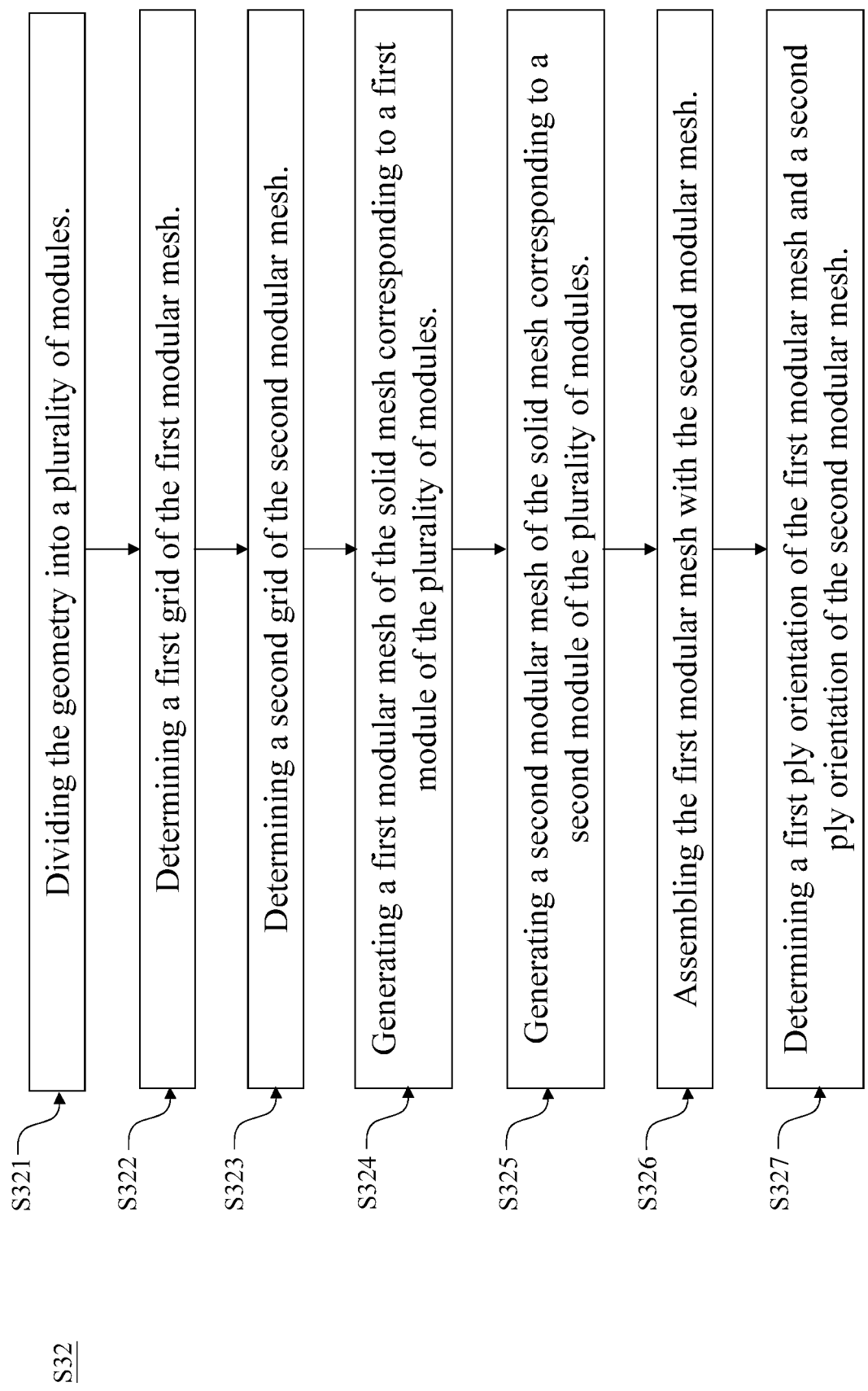
FIG. 5 is a flowchart of an operation of the method according to some embodiments of the present disclosure.

In operation S32, the CAE tool 20 generates the solid mesh M of the target object 10 according to the geometry GM1. The solid mesh M is generated by assembling modular meshes M1 to M3. Details of operation S32 are illustrated in FIG. 5.

In operation S33, the CAE tool 20 obtains the material characteristics MCT. In some embodiments, the material characteristics MCT include material characteristics of the resin and material characteristics of a holder which is configured to enclose the space of the target object 10.

In operation S34, the process parameters PMT are determined. In some embodiments, the process parameters PMT include a resin injection flux, a temperature, and a pressure. In some embodiments, the process parameters PMT are determined by an external instruction. In other embodiments, the process parameters PMT are determined according to a lookup table in the CAE tool 20.

In operation S35, the CAE tool 20 assembles the runner mesh RM of the runner 15 with the solid mesh M. The runner mesh RM abuts the solid mesh M at a selected location LOC, and has grid dimensions DR different from those (D1 to D3) of the solid mesh M. In some embodiments, the selected location LOC is automatically selected by the CAE tool 20. In other embodiments, the selected location LOC is determined by the external instruction. In some embodiments, the runner mesh RM is generated by the CAE tool 20. In other embodiments, the runner mesh RM is built into the CAE tool 20. The selected location LOC is an inlet for filling the resin. Different selected locations LOC can correspond to different forecasted results RST.

After the runner mesh RM is assembled with the solid mesh M, a mesh of an entire structure of the RTM process is formed. Next, in operation S36, the CAE tool 20 generates the forecasted result RST according to the solid mesh M, the runner mesh RM, the material characteristics MCT, and the process parameters PMT. In some embodiments, the CAE tool 20 generates the forecasted result RST based on computational fluid dynamics (CFD) using a finite volume method (FVM). A flow behavior of the resin can be expressed by a volume fraction α of the resin in the target object 10 which can be measured according to governing equations. The CAE tool 20 further uses the volume fraction α to obtain the forecasted result RST. The governing equations can be expressed by following equations (1)-(3):

$$\nabla \cdot u = 0. \quad (1)$$

$$u = -\frac{K}{\eta} \cdot \nabla p. \quad (2)$$

$$\frac{\partial \alpha}{\partial t} + \nabla \cdot (\alpha u) = 0. \quad (3)$$

u is a flow velocity of the resin in the target object 10; p is the pressure; η is a viscosity of the resin; K is a permeability tensor; and t is time.

In operation S37, the CAE tool 20 determines whether the forecasted result RST satisfies the requirement RQ of the RTM process. In some embodiments, the requirement RQ specifies a limited number of voids and/or a limited dimension of voids in the forecasted result RST. The present disclosure is not limited thereto. Various requirements RQ of the RTM process are within the contemplated scope of the present disclosure.

When the forecasted result RST satisfies the requirement RQ, the method 30 proceeds to operation S38. When the forecasted result RST does not satisfy the requirement RQ, the method 30 proceeds to operation S39.

In operation S38, the RTM process is performed on the target object 10 according to the process parameters PMT so as to form the resin product.

In operation S39, the process parameters PMT, the selected location LOC, the ply orientation POT1, the ply orientation POT2, or a combination thereof are adjusted. In some embodiments, the process parameters PMT, the selected location LOC, the ply orientation POT1, the ply orientation POT2, or the combination thereof are adjusted by the CAE tool 20. In other embodiments, the process parameters PMT, the selected location LOC, the ply orientation POT1, the ply orientation POT2, or the combination thereof are adjusted by the external instruction.

After operation S39, the method 30 proceeds to operation S35 to update the solid mesh M and the runner mesh RM, and further to operation S36 to generate an updated forecast result RST. The CAE tool 20 determines whether the updated forecast result RST satisfies the requirement RQ in operation S37. The method 30 proceeds to operation S38 until the updated forecast result RST satisfies the requirement RQ.

Reference is made to FIG. 5. FIG. 5 is a flowchart showing the details of operation S32 of the method 30 according to some embodiments of the present disclosure. Operation S32 includes operations S321, S322, S323, S324, S325, S326, and S327. To facilitate understanding, FIG. 5 is described with respect to FIGS. 1 to 4.

In operation S321, the CAE tool 20 divides the geometry GM1 into first, second and third modules 11, 12 and 13. As illustrated in FIG. 4, the first module 11 and the second module 12 have a boundary BD1 therebetween, and the first module 11 and the third module 13 have a boundary BD2 therebetween.

In operation S322, the CAE tool 20 determines a first grid G1 of a first modular mesh M1 of the first module 11. In operation S323, the CAE tool 20 determines a second grid G2 of a second modular mesh M2 of the second module 12. The first grid G1 and the second grid G2 define segments in the first module 11 and the second module 12, respectively. A dimension of the segments (i.e., grid dimension D1) of the first module 11 is different from a dimension of the segments (i.e., grid dimension D2) of the second module 12. Alternatively stated, a number of the segments of the first module 11 at the boundary BD1 is different from a number of the segments of the second module 12 at the boundary BD1. Therefore, the first grid G1 and the second grid G2 are discontinuous at the boundary BD1. It should be noted that the geometry GM1 can be divided into more than three modules, and operation S32 is also configured to determine a third grid G3 of a third modular mesh M3 of the third module 13 and other grids when the geometry GM1 is divided into more than three modules.

In operation S324, the CAE tool 20 generates the first modular mesh M1 of the solid mesh M, in which the first modular mesh M1 corresponds to the first module 11. In operation S325, the CAE tool 20 generates the second modular mesh M2 of the solid mesh M, in which the second modular mesh M2 corresponds to the second module 12. It should be noted that operation S32 is also configured to generate the third modular mesh M3 and other modular meshes when the geometry GM1 is divided into more than three modules.

As mentioned above, the first grid G1 and the second grid G2 are discontinuous at the boundary BD1. Although the first modular mesh M1 abuts the second modular mesh M2, the first modular mesh M1 has grid dimensions D1 different from those (D2) of the second modular mesh M2. Similarly, the modular meshes M1 to M3 all have different grid dimensions (D1 to D3).

In operation S326, the CAE tool 20 assembles the first modular mesh M1 with the second modular mesh M2. It should be noted that the CAE tool 20 also assembles the first modular mesh M1 and other modular meshes with each other when the geometry GM1 is divided into more than three modules. The solid mesh M is composed of the modular meshes M1 to M3. In other words, the modular meshes M1 to M3 are assembled together to form the solid mesh M.

In operation S327, the ply orientation POT1 of the first modular mesh M1 and the ply orientation POT2 of the second modular mesh M2 are determined. In some embodiments, the resin product is a lay-up fabric structure, therefore, when the CAE tool 20 generates the forecasted result RST, the CAE tool 20 needs to obtain the ply orientations POT1 to POT3 of the lay-up fabric structure corresponding to the modules 11 to 13. In some embodiments, the ply orientations POT1 to POT3 are determined by the CAE tool 20. In other embodiments, the ply orientations POT1 to POT3 are determined by the external instruction.

Figure 6:
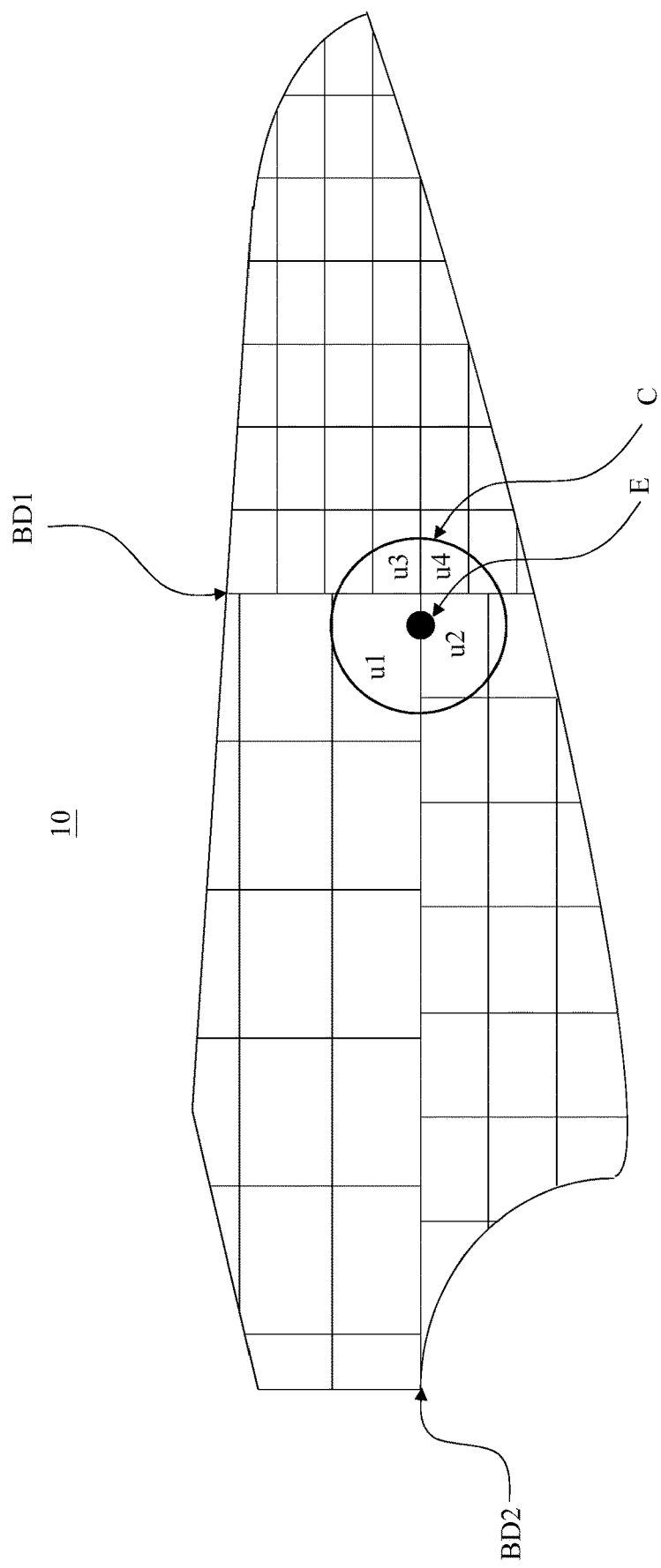
FIG. 6 is a schematic diagram of the target object according to other embodiments of the present disclosure.

Reference is made to FIG. 6. FIG. 6 is a schematic diagram of the target object 10 according to other embodiments of the present disclosure. As mentioned above, the modules 11 to 13 have the different grid dimensions, which results in a poor continuity of the FVM at the boundary BD1 and the boundary BD2. Moreover, the runner mesh RM has the grid dimensions DR different from the grid dimensions (D1 to D3) of the solid mesh M, so the poor continuity also exists at a boundary between the runner mesh RM and the solid mesh M. Therefore, the CAE tool 20 is further configured to adjust the flow velocity u using a field interpolation and a flux calculation in the FVM.

As shown in FIG. 6, a field value and its gradient at a position E need to be modified. A circle C indicates segments which can affect the flow velocity u (denoted by $u_E$) at the position E, wherein the position E is a center of the circle C. The flow velocity u is modified by an equation (4):

$$u_E = \Sigma_i w_i^0 u_i, \; i=1\text{-}4 \qquad (4).$$

Further, the gradient of the flow velocity along y-direction at the position E is modified by equations (5) and (6):

$$\left.\frac{\partial u}{\partial y}\right|_E = \sum_i w_i^y u_i, \; i = 1-4. \qquad (5)$$

$$\left.\frac{\partial u}{\partial x}\right|_E = \sum_i w_i^x u_i, \; i = 1-4 \qquad (6)$$

$w_i$ are weighting coefficients with superscript 0 indicating the factors for value interpolation; and superscript y denoting the weighting factors for y-directional derivative.

Based on the equations (4), (5), and (6), the CAE tool 20 obtains a modified flow velocity u according to the information of several modular meshes M1 to M3 with different grid dimensions (D1 to D3), to generate the forecasted result RST.

In some conventional approaches, every portion of a mesh must have grid dimensions that match those of adjacent portions. This results in a huge amount of time required to generate a mesh with perfect matching. It also slows down the development of the RTM process.

Compared to the above approaches, the CAE tool 20 performs the method 30 to generate the solid mesh M, including the modular meshes M1 to M3 having the non-matching grid dimensions, for obtaining the forecasted result RST of the RTM process. Because of the non-matching modular meshes M1 to M3, the CAE tool 20 can generate the solid mesh M very quickly without lengthy trial-and-error testing. The RTM process efficiency is thus improved.

Figure 7:
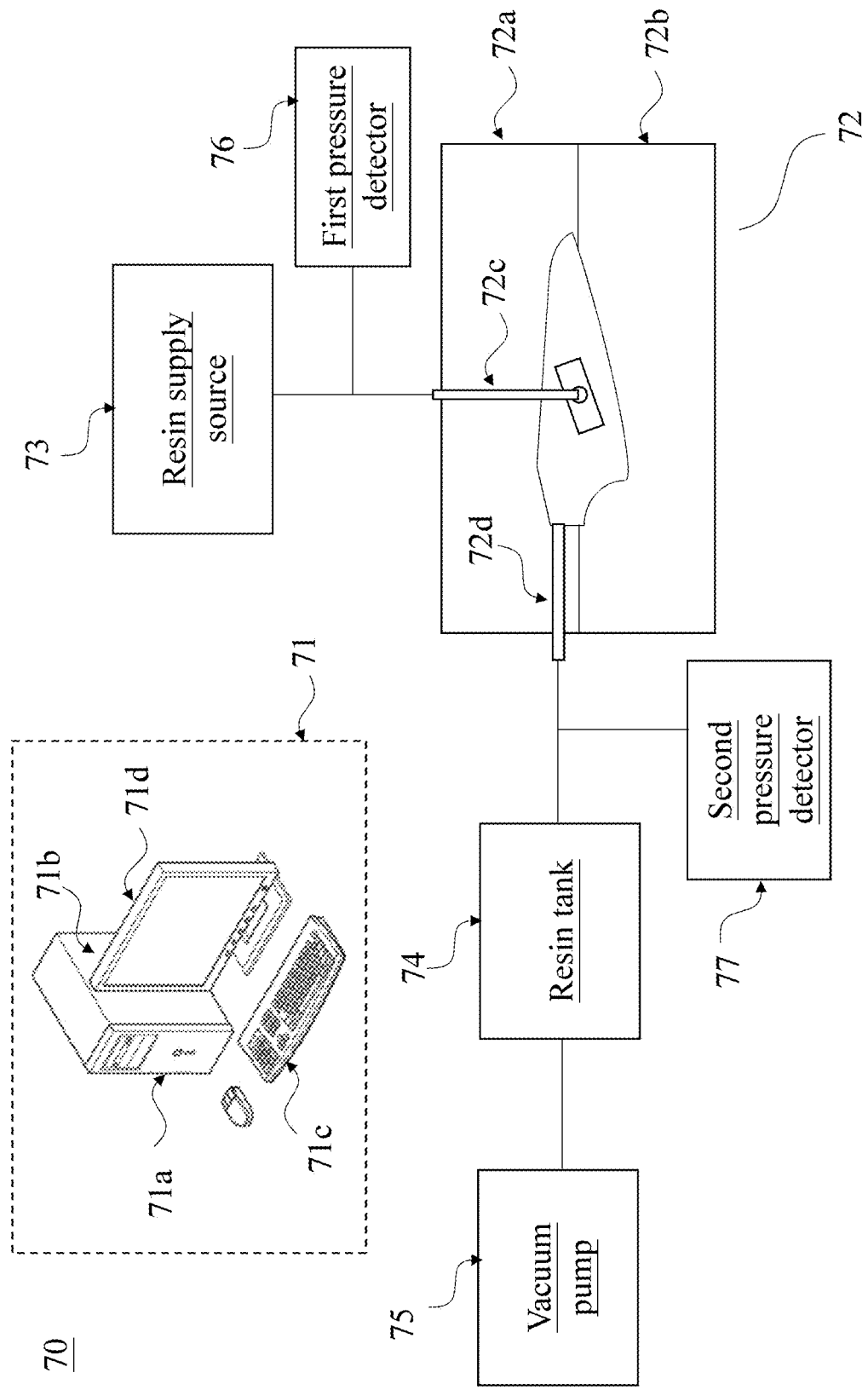
FIG. 7 is a schematic diagram of a resin transfer molding system according to some embodiments of the present disclosure.

Reference is made to FIG. 7. FIG. 7 is a schematic diagram of an RTM system 70 according to some embodiments of the present disclosure. The RTM system 70 is configured to perform the method 30 as illustrated in FIG. 3 and the RTM process.

The RTM system 70 includes a computing apparatus 71, a mold 72, a resin supply source 73, a resin tank 74, a vacuum pump 75, a first pressure detector 76, and a second pressure detector 77.

The mold 72 includes an upper mold 72a and a bottom mold 72b, and the upper mold 72a and the bottom mold 72b enclose a space which form the target object 10. The mold 72 further includes an inlet port 72c and an outlet port 72b. The resin is transferred into the mold 72 through the inlet port 72, and the air and/or resin residual are removed from the mold 72 through the outlet port 72d.

The resin supply source 73 is configured to store the resin, and provide the resin to the mold 71 during the RTM process. The resin tank 74 is configured to receive the resin evacuated from the mold 72. The vacuum pump 75 is configured to create a negative pressure so as to suck the resin from the mold 72. The first pressure detector 76 and the second pressure detector 77 are configured measure the pressure of the resin injected into the mold 72 and the pressure of the resin sucked out form the mold 72, respectively.

The computing apparatus 71 the CAE tool 20 configured to perform the method 30 and generate the forecasted result RST. When the forecasted result RST satisfies the requirement RQ, the computing apparatus 71 is further configured to control the resin supply source 73, the resin tank, and the vacuum pump 75 to perform the RTM process so as to form the resin product.

In some embodiments, the computing apparatus 71 is coupled to the first pressure detector 76 and the second pressure detector 77 to monitor the pressure of resin during the RTM process.

In some embodiments, the computing apparatus 71 includes a process module 71a, a storage module 71b, an input/output (I/O) interface 71c and a display 71d. The process module 71a is implemented with the CAE tool 20 configured to perform the method 30. The storage module 71b is configured to store data which is used in the method 30. In some embodiments, the data includes the geometry GM1, the geometry GM2, the process parameters PMT, the material characteristics MCT, the orientations POT1 to POT3, the solid mesh M, the runner mesh RM, the modular meshes M1 to M3, the requirement RQ, the forecasted result RST, or the combination thereof. The I/O interface 71c is configured to receive the external instruction and/or transmit the forecasted result RST to the display 71d. Under this arrangement, the process module 71a communicates with the storage module 71b and the I/O interface 71c to operate the CAE tool 20.

One aspect of the present disclosure provides a method of mesh generation for an RTM process. The method includes operations of: obtaining a geometry of a target object; generating a solid mesh of the target object according to the geometry; obtaining material characteristics of the target object; assembling a runner mesh of a runner with the solid mesh, wherein the runner mesh has grid dimensions different from those of the solid mesh; determining process parameters of the RTM process; and generating a forecasted result of the RTM process according to the solid mesh, the runner mesh, the process parameters, and the material characteristics. Generating the solid mesh of the target object according to the geometry includes operations of: dividing the geometry into a plurality of modules; generating a first modular mesh of the solid mesh corresponding to a first module of the plurality of modules; and generating a second modular mesh of the solid mesh corresponding to a second module of the plurality of modules, wherein the second modular mesh abuts the first modular mesh, and the second modular mesh has grid dimensions different from those of the first modular mesh.

Another aspect of the present disclosure provides an RTM system, including a mold, a resin supply source, a resin tank, and a computing apparatus. The mold is configured to form a target object. The resin supply source is configured to provide a resin for the RTM process. The resin tank is configured to receive the resin from the mold during the RTM process. The computing apparatus includes a process module. The process module is configured to perform: obtaining a geometry of the target object; generating a solid mesh of the target object according to the geometry; obtaining material characteristics of the target object; assembling a runner mesh of a runner with the solid mesh, wherein the runner mesh has grid dimensions different from those of the solid mesh; determining process parameters of the RTM process; and generating a forecasted result of the RTM process according to the solid mesh, the runner mesh, the process parameters, and the material characteristics.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method of mesh generation for a resin transfer molding (RTM) process, comprising:
  obtaining a geometry of a target object;
  generating a solid mesh of the target object according to the geometry, comprising:
    dividing the geometry into a plurality of modules;
    generating a first modular mesh of the solid mesh corresponding to a first module of the plurality of modules; and
    generating a second modular mesh of the solid mesh corresponding to a second module of the plurality of modules, wherein the second modular mesh abuts the first modular mesh, and the second modular mesh has grid dimensions different from those of the first modular mesh;
  obtaining material characteristics of the target object wherein the material characteristics comprise a flow velocity of a resin in the target object;
  assembling a runner mesh of a runner with the solid mesh, wherein the runner mesh has grid dimensions different from those of the solid mesh;
  determining process parameters of the RTM process; and
  generating a forecasted result of the RTM process according to the solid mesh, the runner mesh, the process parameters, and the material characteristics,
  wherein the flow velocity at a boundary between the first modular mesh and the second modular mesh is obtained based on an equation, and the equation is represented by an expression:

$$u_E = \sum_i w_i^0 u_i$$

wherein $u_E$ is the flow velocity at a point E of the boundary, and $w_i^0$ is a weighting coefficient of a first grid of the first modular mesh or a second grid of the second modular mesh, and $u_i$ is the flow velocity at the first grid of the first modular mesh or the second grid of the second modular mesh.

2. The method of claim 1, wherein the operation of generating the solid mesh of the target object according to the geometry further comprises:
  assembling the first modular mesh with the second modular mesh; and
  determining a first ply orientation of the first modular mesh and a second ply orientation of the second modular mesh.

3. The method of claim 2, further comprising:
  determining whether the forecasted result satisfies a dimension of voids of the RTM process; and
  performing the RTM process on the target object according to the process parameters when the forecasted result satisfies the dimension of voids.

4. The method of claim 3, further comprising:
  adjusting the process parameters when the forecasted result does not satisfy the dimension of voids.

5. The method of claim 3, further comprising:
  adjusting a location of the runner mesh on the solid mesh when the forecasted result does not satisfy the dimension of voids.

6. The method of claim 3, further comprising:
  adjusting the first ply orientation and the second ply orientation when the forecasted result does not satisfy the dimension of voids.

7. The method of claim 3, further comprising:
  performing the operation of generating the forecasted result of the RTM process according to the solid mesh, the runner mesh, the process parameters, and the material characteristics again, when the forecasted result does not satisfy the dimension of voids.

8. The method of claim 1, wherein the operation of generating the solid mesh of the target object according to the geometry further comprises:
  determining a first grid of the first modular mesh; and
  determining a second grid of the second modular mesh, wherein the first modular mesh is generated according to the first grid, and the second modular mesh is generated according to the second grid.

9. The method of claim 8, wherein the first grid comprises a first number of segments along a boundary between the first modular mesh and the second modular mesh, and the second grid comprises a second number of segments along the boundary.

10. The method of claim 9, wherein the first number is different from the second number.

* * * * *